United States Patent
Lin et al.

(10) Patent No.: US 7,450,041 B2
(45) Date of Patent: *Nov. 11, 2008

(54) ERROR CANCELLING COMPARATOR BASED SWITCH CAPACITOR CIRCUIT AND METHOD THEREOF

(75) Inventors: Chia-Liang Lin, Union City, CA (US); Gerchih Chou, San Jose, CA (US)

(73) Assignee: Realtek Semiconductor Corp., Science Park, HsinChu (TW)

( * ) Notice: Subject to any disclaimer, the term of this patent is extended or adjusted under 35 U.S.C. 154(b) by 322 days.

This patent is subject to a terminal disclaimer.

(21) Appl. No.: 11/277,939

(22) Filed: Mar. 29, 2006

(65) Prior Publication Data

US 2007/0236371 A1    Oct. 11, 2007

(51) Int. Cl.
*H03M 1/06* (2006.01)
(52) U.S. Cl. .................. 341/118; 341/150; 341/172
(58) Field of Classification Search ............. 341/118, 341/150, 172
See application file for complete search history.

(56) References Cited

U.S. PATENT DOCUMENTS

| | | | |
|---|---|---|---|
| 4,400,637 A * | 8/1983 | Klar et al. | 327/336 |
| 5,475,326 A | 12/1995 | Masuda | |
| 5,929,677 A | 7/1999 | Murata | |
| 6,157,322 A | 12/2000 | Anderson | |
| 6,271,784 B1 | 8/2001 | Lynn | |
| 6,525,684 B2 | 2/2003 | Tsujikawa | |
| 6,922,097 B2 | 7/2005 | Chan | |
| 7,023,250 B2 | 4/2006 | Chen | |
| 7,202,718 B2 | 4/2007 | Lindner | |
| 7,242,331 B1 * | 7/2007 | Lin | 341/118 |
| 7,245,245 B2 | 7/2007 | Chien | |
| 7,319,425 B2 * | 1/2008 | Fiorenza et al. | 341/172 |
| 2006/0208938 A1 | 9/2006 | Fiorenza | |
| 2007/0035335 A1 | 2/2007 | Lee | |

OTHER PUBLICATIONS

Todd Sepke et al. "Comparator-Based Switched-Capacitor Circuits For Sealed CMOS Technologies.", ISSCC 2006 / Session 12 / Nyquist ADCs / 12.4, Feb. 7, 2006, pp. 220-221, pp. 649. 2006 IEEE International Solid-State Circuits Conference.

Fiorenza, John K. et al."Comparator-Based Switched-Capacitor Circuits for Scaled CMOS technologies", IEEE Journal of Solid-State Circuits. vol. 41, No. 12, Dec. 2006, pp. 2658-2668.

* cited by examiner

*Primary Examiner*—Khai M Nguyen
(74) *Attorney, Agent, or Firm*—Winston Hsu

(57) ABSTRACT

An error canceling comparator based switch capacitor (CBSC) circuit cyclically works through multiple phases including a sampling phase and a transfer phase. During the sampling phase, an input voltage and also an error due to circuit non-idealities are sampled. During the transfer phase, the sampled input voltage is amplified by a fixed ratio and transferred to an output load, while the error is cancelled by reversing the polarity of connection for an internal capacitor within the CBSC circuit.

20 Claims, 4 Drawing Sheets

ERROR CANCELLING COMPARATOR BASED SWITCH CAPACITOR CIRCUIT AND METHOD THEREOF

CROSS REFERENCE TO RELATED APPLICATIONS

This application is related to the following copending application, owned by the assignee of this invention:
1) Ser. No. 11/277,942, for "ERROR AVERAGING COMPARATOR BASED SWITCH CAPACITOR CIRCUIT AND METHOD THEREOF"
2) Ser. No. 11/278,432, for "NOISE SHAPING COMPARATOR BASED SWITCH CAPACITOR CIRCUIT AND METHOD THEREOF"

BACKGROUND OF THE INVENTION

1. Field of the Invention

The present invention relates to comparator based switch capacitor circuit, in particular to comparator based switch capacitor circuit that performs circuit error cancellation.

2. Description of Related Art

Comparator based switch capacitor (CBSC) circuit is an emerging technology that offers many advantages over conventional operational amplifier based switch capacitor circuit. Like a conventional switch capacitor circuit, a CBSC circuit also works in a two-phase manner. The two phases are "sampling" phase and "transfer" phase, controlled by two non-overlapping clocks, say $\phi_1$ and $\phi_2$, respectively. In a typical two-phase CBSC circuit working at a sampling rate of f, the duration of each phase is slightly less than half of the sampling clock period $T=1/f$. During sampling phase ($\phi_1$), an input voltage $V_I$ is sampled using a sampling capacitor $C_1$ by connecting the "+" end of $C_1$ to $V_I$ and the "−" end to a common mode voltage $V_{CM}$. During transfer phase ($\phi_2$), the charge stored on the sampling capacitor $C_1$ is transferred to an integrating capacitor $C_2$ via a charge transfer circuit comprising a comparator 130 and a charge pump (CP) 140, which includes a current source $I_1$ and a current sink $I_2$, as shown in FIG. 1. In FIG. 1, $C_L$ is a load capacitor for the CBSC circuit 100, $V_{DD}$ is a supply voltage, $V_{SS}$ is the lowest potential in the system. Note that $V_{CM}$ is the common mode voltage that is usually close to the mean value of $V_{DD}$ and $V_{SS}$. Also, $C_L$ is terminated to $V_{CM}$ via a sampling switch 150, which is controlled by a switch signal S. The purpose of the charge transfer circuit is to transfer the charge stored on $C_1$ to $C_2$ until the potentials on the two input ends of comparator 130 are equal, i.e. $V_X = V_{CM}$. The principle of the CBSC circuit 100 during transfer phase ($\phi_2$) is briefly described as follows.

At the beginning of the charge transfer phase, a brief preset (P) must be performed to clear $C_L$ and ensure the voltage $V_X$ is below $V_{CM}$. The preset is done by momentarily pulling the output node $V_O$ to $V_{SS}$, the lowest potential in the system. Next, a coarse charge transfer phase ($E_1$) begins. During coarse charge transfer phase, $V_X < V_{CM}$ and CP 140 turns on the current source $I_1$ to inject charge into the circuit comprising $C_L$, $C_2$, and $C_1$, resulting in a relatively fast voltage ramp on $V_X$ toward $V_{CM}$. CP 140 continues to inject charge until comparator 130 detects $V_X > V_{CM}$. At the instant where comparator 130 detects $V_X > V_{CM}$, a fine charge transfer phase ($E_2$) commences by turning off the current source $I_1$ and turning on the current sink $I_2$ to drain charge from the circuit comprising $C_L$, $C_1$, and $C_2$. One deliberately chooses $I_2$ to be lower than $I_1$, resulting in a relatively slow voltage ramp down on $V_X$ back toward $V_{CM}$. At the instant where the comparator 130 detects $V_X < V_{CM}$ again, the sampling switch 150 is opened and the charge stored on $C_L$ is sampled and frozen.

FIG. 2 depicts a typical timing diagram for the CBSC circuit 100 for the charge transfer phase. Initially the switch signal S is asserted. As a result, the sampling switch 150 is closed and the load $C_L$ is terminated to $V_{CM}$. In the mean while, $V_O$ stays at the sampled level from the previous cycle and $V_X$ is close to $V_{CM}$. The transfer phase $\phi_2$, starting at time $t_1$ and ending at time $t_5$, comprises four sub-phases: preset (P), coarse charge transfer ($E_1$), fine charge transfer ($E_2$), and hold (H). The CBSC circuit 100 first enters the P phase (at time $t_1$), where it pulls the output node $V_O$ to $V_{SS}$ and causes $V_X$ to drop to $V_{XO}$, which is below $V_{CM}$. At time $t_2$, it enters the $E_1$ phase, where comparator detects $V_X < V_{CM}$ and CP 140 injects charge into the circuit comprising $C_L$, $C_2$, and $C_1$, resulting in relatively fast voltage ramp up on both $V_O$ and $V_X$. The $E_2$ phase starts at time $t_3$, the instant where comparator 130 detects $V_X > V_{CM}$. Note that due to circuit delay, $t_3$ slightly trails the exact time instant where $V_X$ rises past $V_{CM}$. During the $E_2$ phase, CP 140 drains charge from the circuit comprising $C_L$, $C_2$, and $C_1$, resulting in a relatively slow voltage ramp down on both $V_O$ and $V_X$. Finally, the CBSC circuit 100 enters the H phase at time $t_4$, where comparator 130 detects $V_X < V_{CM}$ again. Again, due to circuit delay, $t_4$ slightly trails the exact time instant where $V_X$ falls past $V_{CM}$. During the H phase, S is de-asserted and thus the charge stored on $C_L$ is frozen, and also charge pump circuit CP 140 is disabled.

There are two problems associated with the prior art CBSC circuit 100. First, there is always an error on the final sampled value of $V_O$ due to the circuit delay. As clearly seen in FIG. 2, the actual sampled value is always slightly lower than the ideal sample value, which is the value at the exact time instant where $V_X$ falls past $V_{CM}$. Second, the prior art CBSC circuit 100 is subject to error due to the offset in the comparator 130.

What is needed is a method to remove the errors due to circuit non-idealities, in particular circuit delay and comparator offset, for CBSC circuit.

BRIEF SUMMARY OF THIS INVENTION

In an embodiment, an error canceling comparator based switch capacitor (CBSC) circuit is disclosed; the circuit comprises a comparator, a charge pump circuit, and a plurality of capacitors; and the CBSC works cyclically through multiple phases including at least a sampling phase ($\phi_1$) and a transfer phase ($\phi_2$), wherein during the sampling phase ($\phi_1$) the CBSC circuit samples both an input voltage and an error due to circuit non-idealities and during the transfer ($\phi_2$) phase the CBSC amplifies the sampled input voltage by a fixed ratio and transfers a resultant voltage to a load capacitor while canceling the error by reversing a polarity of connection for an internal capacitor within the CBSC circuit.

In an embodiment, a method of canceling error in a comparator based switch capacitor (CBSC) is disclosed; the circuit comprises a comparator, a charge pump circuit, and a plurality of capacitors; and the method comprises: operating the CBSC circuit cyclically through multiple phases including at least a sampling phase ($\phi_1$) and a transfer phase ($\phi_2$), sampling an error due to circuit non-idealities during the sampling phase ($\phi_1$), and canceling the error by reversing the polarity of connection for an internal capacitor within the CBSC circuit during the transfer phase ($\phi_2$).

BRIEF DESCRIPTION OF THE DRAWINGS

The subject matter regarded as the invention is particularly pointed out and distinctly claimed in the concluding portion of the specification. The invention, both as to device and method of operation, together with features and advantages thereof may best be understood by reference to the following detailed description with the accompanying drawings in which:

DETAILED DESCRIPTION OF THIS INVENTION

The present invention relates to error cancellation for comparator based switch capacitor (CBSC) circuit. While the specifications describe several example embodiments of the invention considered best modes of practicing the invention, it should be understood that the invention can be implemented in many ways and is not limited to the particular examples described below or to the particular manner in which any features of such examples are implemented.

The present invention is general and applicable to any sampled-data analog circuit. For example, the present invention can be applied to a pipeline ADC (analog-digital converter), and also to a delta-sigma ADC (analog-digital converter). A sampled-data analog circuit usually works in a multi-phase manner. By way of example but not limitation, a two-phase switch-capacitor circuit in accordance with the present invention is disclosed. Like the prior art described earlier, the two phases are sampling phase ($\phi_1$) and transfer phase ($\phi_2$). Without loss of generality, a pipeline ADC will be used as an example to illustrate the principle taught by the present invention.

Figure 1:
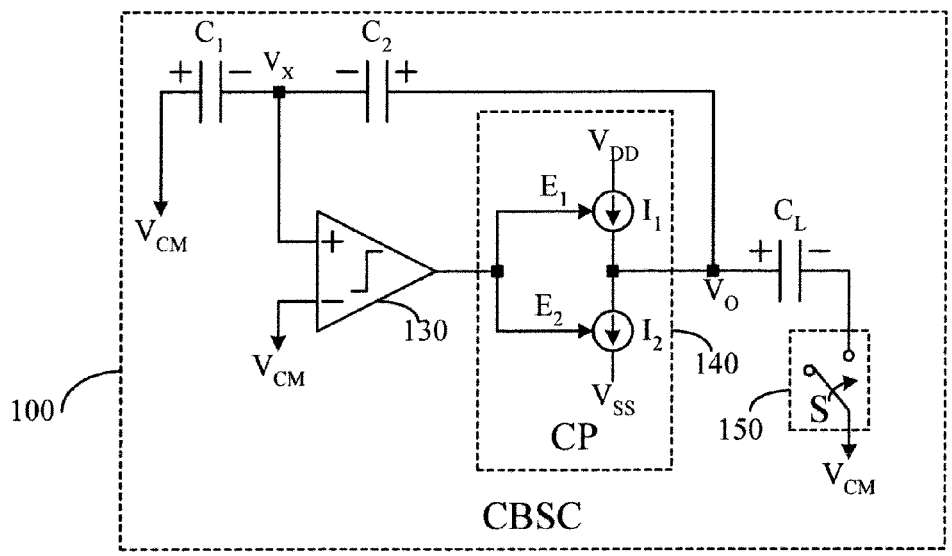
FIG. 1 depicts a prior art comparator based switch capacitor (CBSC) circuit during transfer phase.
Figure 3:
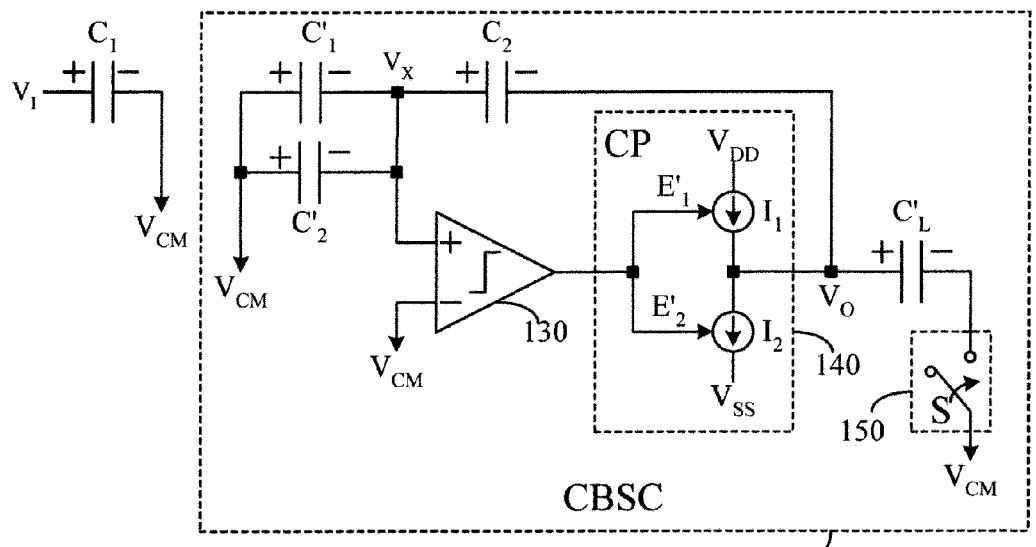
FIG. 3 depicts an embodiment of CBSC circuit during sampling phase in accordance with the present invention.

In a preferred embodiment, the circuit configuration during sampling phase ($\phi_1$) is depicted in FIG. 3. Here, the input voltage $V_I$ is sampled by $C_1$, just like the case in the prior art described earlier. At the same time, however, one also uses a CBSC circuit 100A that is exactly the same as the prior art CBSC 100 circuit shown in FIG. 1 except for the following changes: (1) $C_1$ is replaced by $C'_1$, which has substantially the same capacitance as $C_1$, (2) $C_L$ is replaced by $C'_L$, which has substantially the same capacitance as $C_L$, (3) $C_2$ is connected in a reverse polarity, and (4) an additional capacitor $C'_2$ having substantially the same capacitance as $C_2$ is connected in parallel with $C'_1$. CBSC 100A has substantially the same configuration as CBSC 100, and also works in a very similar manner.

Figure 2:
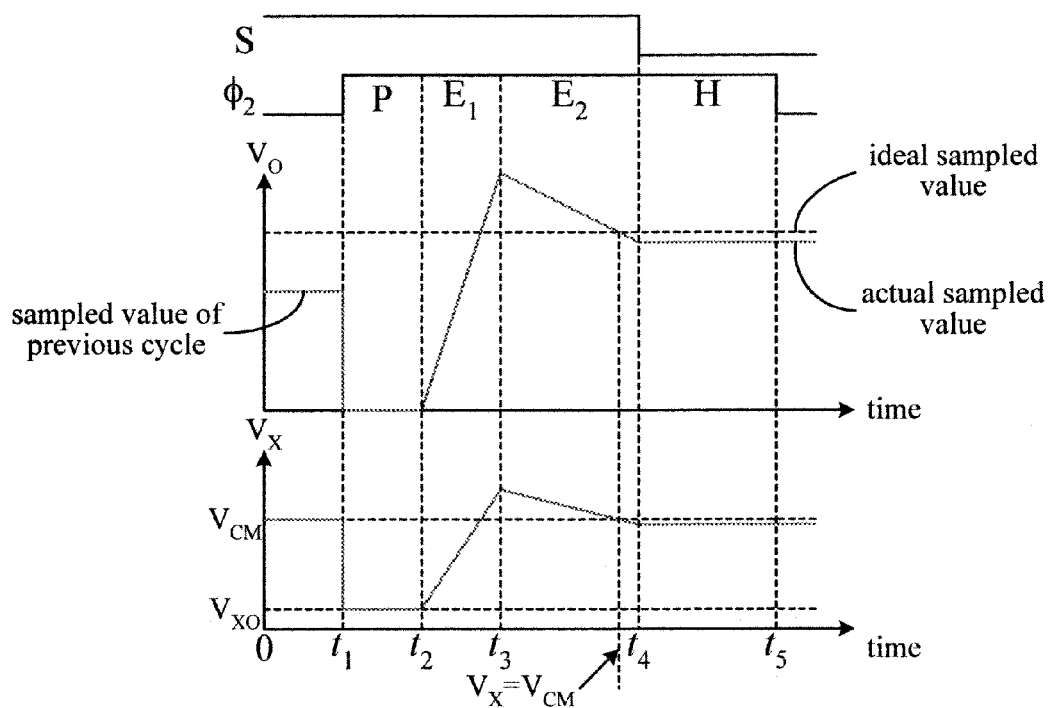
FIG. 2 depicts a typical timing diagram for the CBSC circuit depicted in FIG. 1.
Figure 4:
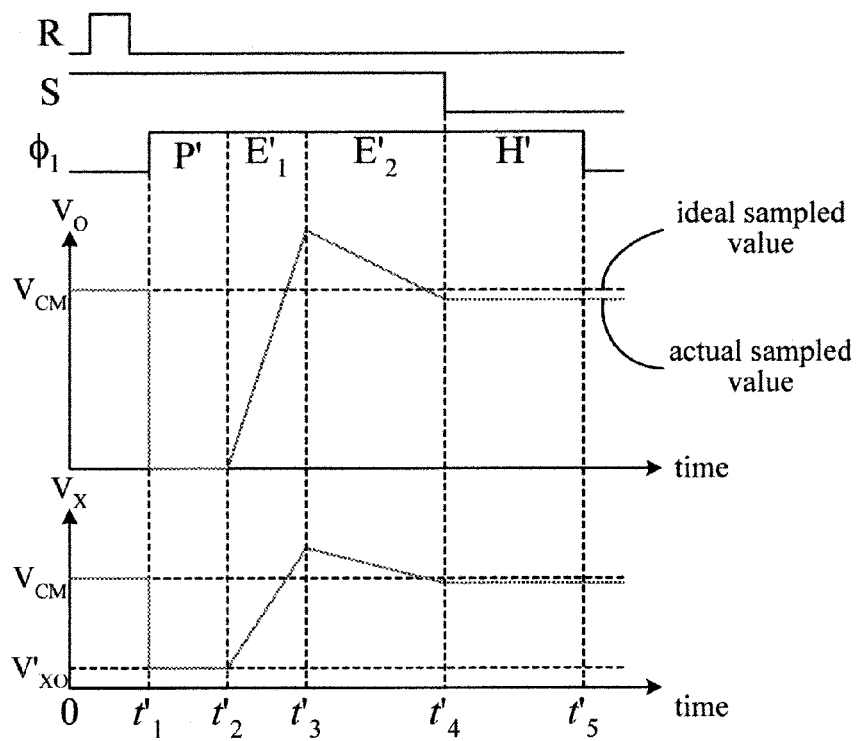
FIG. 4 depicts a typical timing diagram for the CBSC circuit depicted in FIG. 3.

An exemplary timing diagram for CBSC 100A is shown in FIG. 4, which is very similar to FIG. 2 except for (1) an additional signal R is used to clear up the respective charges stored on $C'_1$, $C_2$, and $C'_2$ by connecting their both ends to $V_{CM}$, (2) clock $\phi_2$ is replaced by clock $\phi_1$, (3) phases P, $E_1$, $E_2$, and H are replaced by P', $E'_1$, $E'_2$, and H', respectively, and (4) timing instants $t_1$ to $t_5$ are replaced by $t'_1$ to $t'_5$, respectively. The signal R is momentarily asserted for a brief time and then de-asserted before time $t'_1$, where the sampling phase ($\phi_1$) commences. Due to the signal R, both $C'_1$ and $C'_2$ have zero charge right before CBSC 100A enters the sampling phase ($\phi_1$). The sampling phase ($\phi_1$), starting at time $t'_1$ and ending at time $t'_5$, comprises four sub-phases: preset (P'), coarse charge transfer ($E'_1$), fine charge transfer ($E'_2$), and hold (H'). The CBSC circuit 100A first enters the P' phase (at time $t'_1$), where it pulls the output node $V_O$ to $V_{SS}$ and causes $V_X$ to drop to $V'_{XO}$, which is below $V_{CM}$. At time $t'_2$, it enters the $E'_2$ phase, where comparator detects $V_X<V_{CM}$ and CP 140 injects charge into the circuit comprising $C'_L$, $C_2$, $C'_1$, and $C'_2$, resulting in relatively fast voltage ramp up on both $V_O$ and $V_X$. The $E'_2$ phase starts at time $t'_3$, the instant where comparator 130 detects $V_X>V_{CM}$. Note that due to circuit delay, t'3 slightly trails the exact time instant where $V_X$ rises past $V_{CM}$. During the $E'_2$ phase, CP 140 drains charge from the circuit comprising $C'_L$, $C_2$, $C'_1$, and $C'_2$, resulting in a relatively slow voltage ramp down on both $V_O$ and $V_X$. Finally, the CBSC circuit 100A enters the H' phase at time $t'_4$, where comparator 130 detects $V_X<V_{CM}$ again. Again, due to circuit delay, $t'_4$ slightly trails the exact time instant where $V_X$ falls past $V_{CM}$. During the H' phase, S is de-asserted and charge pump circuit CP 140 is disabled. Thus, the charges stored on $C'_1$, $C'_2$, $C_2$, and $C'_L$ are all frozen.

If CBSC 100A has zero comparator offset and zero circuit delay, then there will be zero charge on all for capacitors $C'_1$, $C'_2$, $C_2$, and $C'_L$ at the end of sampling phase ($\phi_1$). However, due to nonzero comparator offset and circuit delay, there will be some charge stored for each of the four capacitors. Let the comparator offset be $V_{OS}$ (i.e. comparator 130 favorably gives the "−" end an advantage in an amount of $V_{OS}$ when performing comparison.) Let the current draining from $C_2$ during $E'_2$ be I. Also, let the circuit delay between the exact timing instant where $V_X$ falls past $V_{CM}$ and the actual timing instant where comparator 130 detects $V_X<V_{CM}$ be $\tau$. Then, at the end of sampling phase ($\phi_1$), the charges on $C_1$, $C'_2$, and $C_2$ are:

$$Q_1 = C_1(V_1 - V_{CM})$$

$$Q'_2 = -C'_2 V_{OS} + \frac{I\tau C'_2}{C'_1 + C'_2}$$

and $$Q_2 = -(C'_1 + C'_2)V_{OS} + I\tau,$$

respectively.

Figure 5:
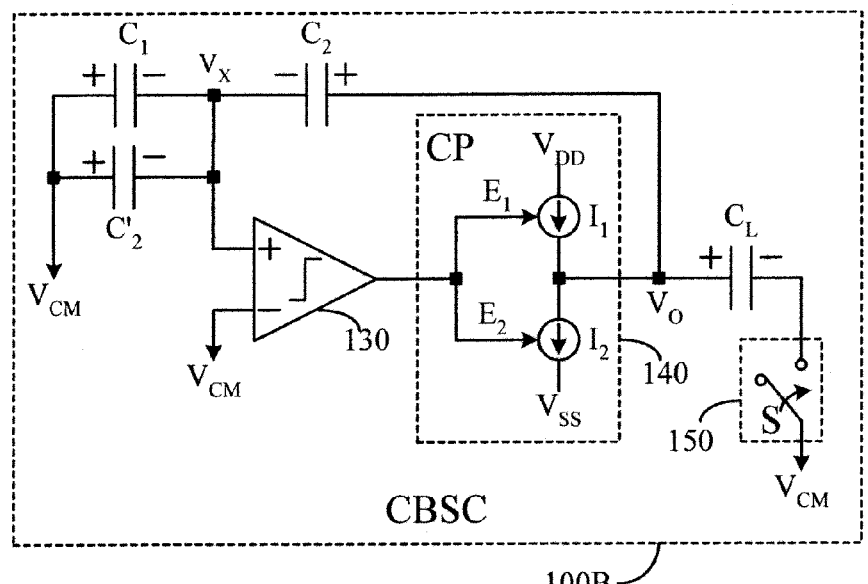
FIG. 5 depicts an embodiment of CBSC circuit during transfer phase in accordance with the present invention.

In a preferred embodiment, the circuit configuration during transfer phase ($\phi_2$) is depicted in FIG. 5. Here, one uses a CBSC circuit 100B that is substantially the same as the prior art CBSC 100 circuit shown in FIG. 1 except that the additional capacitor $C'_2$, which stores an error charge $Q'_2$ at the end of the transfer phase ($\phi_1$), is now connected in parallel with $C_1$. CBSC 100B has substantially the same configuration as CBSC 100, and also works in a similar manner.

Figure 6:
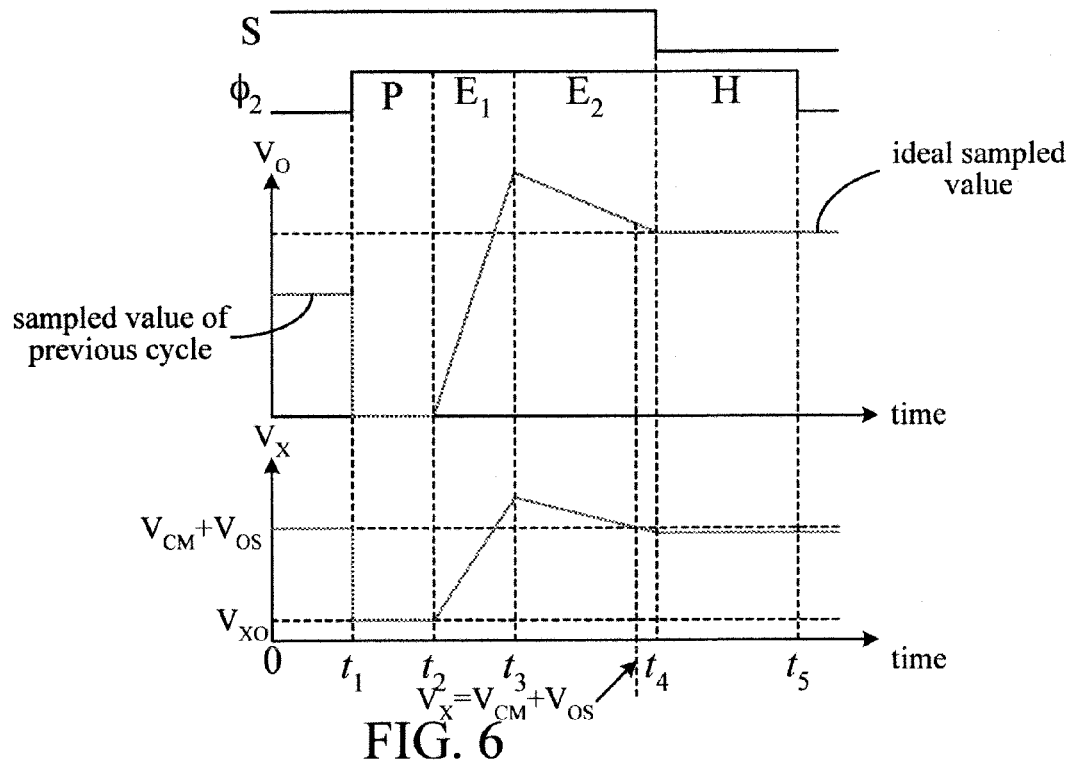
FIG. 6 depicts a typical timing diagram for the CBSC circuit depicted in FIG. 5.

An exemplary timing diagram for CBSC 100B is shown in FIG. 6, which is essentially the same as FIG. 2 except that the output voltage $V_O$ is exactly the same as the ideal sampled value at the end of the clock transfer. (Besides, unlike in FIG. 2 where comparator offset is not included, we have included in FIG. 6 an offset voltage $V_{OS}$ in the $V_X$ waveform.) The error due to comparator offset and circuit delay is cancelled due to the initial error charges $Q'_2$ and $Q_2$ stored on $C'_2$ and $C_2$ respectively. The exact cancellation is proved as follows.

In connecting $C_1$ in parallel with $C'_2$, a charge sharing occurs to make the voltage across $C_1$ identical with the voltage across $C'_2$. The initial value of $V_X$ right before CBSC 100B enters transfer phase ($\phi_2$) is $$V_X^{(init)} = V_{CM} - \frac{Q_1 + Q_2'}{C_1 + C_2'}$$

During P phase, $V_O$ is momentarily pulled low and so is $V_X$. During $E_1$ phase, CP 140 injects charge so that $V_X$ rises toward $V_{CM}+V_{OS}$. Slightly after $V_X$ rises past $V_{CM}+V_{OS}$, $E_2$ phase commences and CP 140 drains charge so that $V_X$ falls toward $V_{CM}+V_{OS}$. Slightly after $V_X$ falls past $V_{CM}+V_{OS}$, H phase commences and the charges stored on all four capacitors ($C_1$, $C_2$, $C'_2$, and $C_L$) are frozen. The final value of $V_X$ is then $$V_X^{(final)} = V_{CM} + V_{OS} - \frac{I\tau}{C_1 + C_2'}$$

The total net charge transferred from $C_1$ and $C'_2$ to $C_2$ during the entire transfer phase ($\phi_2$) is then $$Q_t = (C_1 + C_2') \cdot (V_X^{(final)} - V_X^{(init)})$$

Therefore, at the end of transfer phase ($\phi_2$), the charge stored on $C_2$ is $$Q_2^{(final)} = Q_2 + Q_t = -(C_1' + C_2')V_{OS} + I\tau + (C_1 + C_2') \cdot (V_X^{(final)} - V_X^{(init)})$$

The final output voltage $V_O$ is then $$V_O^{(final)} = V_X^{(final)} + \frac{Q_2^{(final)}}{C_2}$$

By manipulating above listed algebraic equations along with the conditions $C'_1 = C_1$ and $C'_2 = C_2$, one obtains $$V_O^{(final)} = V_{CM} + (V_I - V_{CM}) \cdot C_1/C_2,$$

which is exactly the correct final output voltage for the case of zero comparator offset and zero circuit delay. The error due to comparator offset and circuit delay, therefore, has been completely cancelled.

Figure 7:
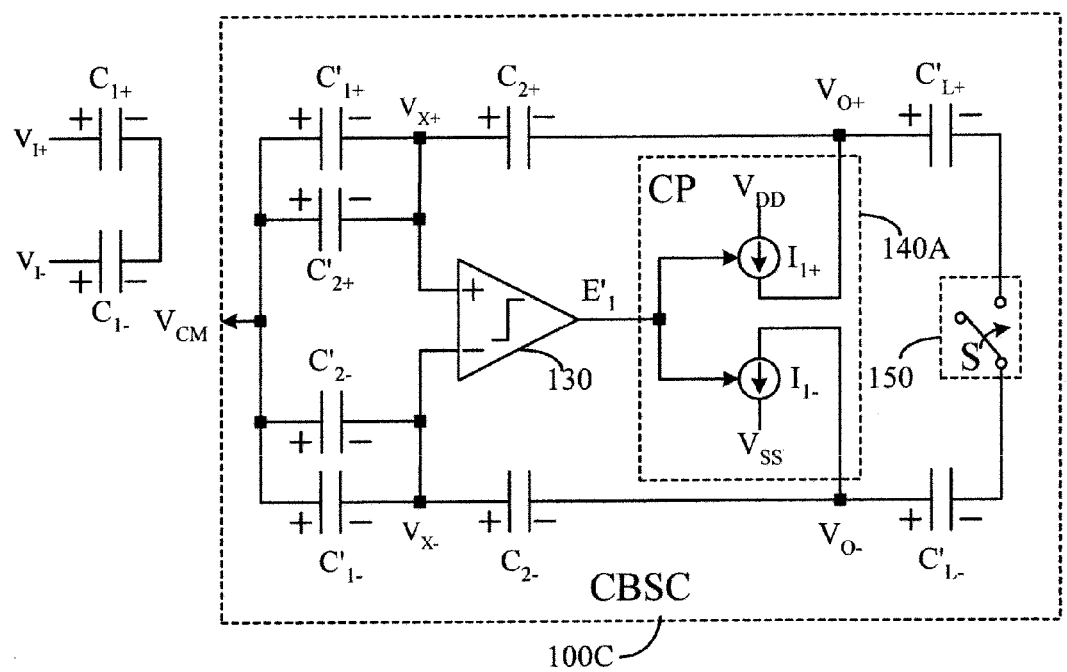
FIG. 7 depicts a differential version of the circuit depicted in FIG. 5.

For those of ordinary skill in the art, the principle disclosed by the present invention can be practiced in various alternative forms, including the following:

1. In an embodiment, one may pull the output voltage $V_O$ to $V_{DD}$, the highest potential of the system, during the preset (P or P') phase, thus forcing the condition $V_X > V_{CM}$ before entering the coarse transfer phase ($E_1$ or $E'_1$). In that scenario, $I_1$ needs to be changed to a current sink while $I_2$ needs to be changed to a current source.
2. In an embodiment, one may totally eliminate the fine transfer phases $E'_2$ and $E_2$, as the error due to circuit delay will be completely eliminated and therefore there is no need to use a fine transfer phase to reduce the error caused by circuit delay. In this case, the $I_2$ current is eliminated, and the overall operation speed of the switch capacitor circuit improves.
3. In an embodiment, one may use a differential circuit instead of a single-ended circuit. FIG. 7 depicts an exemplary circuit that is a differential counterpart to the single-ended circuit depicted in FIG. 5 for the sampling phase ($\phi_1$). Note that although the fine transfer phase $E'_2$ is eliminated in CP 140A of FIG. 7, for those of ordinary skill in the art it is straightforward to include the fine transfer phase by adding a current source $I_{2+}$ and a current sink $I_{2-}$ that are both controlled by $E'_2$. Also, for those of ordinary skill in the art, it is straightforward to use a similar way to construct a differential counterpart to the single-ended circuit depicted in FIG. 6 for the transfer phase ($\phi_2$).
4. In an embodiment, during transfer phase ($\phi_2$), the "+" end of capacitor $C_1$ and/or the "+" end of capacitor $C'_2$ in FIG. 5 may be connected to a voltage different from $V_{CM}$. For example, for a pipeline ADC application, the "+" end of either capacitor may be connected to one of many other predefined voltages depending on the range of the voltage $V_I$. The principle taught by the present invention, however, applies equally well to that scenario.
5. In a further embodiment, the capacitor $C'_2$ is implemented using a plurality of capacitors, which are connected in parallel during the sampling phase ($\phi_1$), but during the transfer phase ($\phi_2$) their "+" ends may be connected to different voltages, each chosen from either among many predefined voltages or connected to an internal node within the system. The principle taught by the present invention, however, applies equally well to that scenario.
6. In a further embodiment, one may choose to clear up the charges on $C_2$, $C'_1$, and $C'_2$ (by asserting the R signal) following the end of the transfer phase ($\phi_2$), instead of preceding the beginning of the sampling phase ($\phi_1$).

Also, there are many switches (besides switch 150) that are needed but not displayed in any of the figures. They are controlled by a plurality of clock signals to define the circuit configuration (i.e. the connections among circuit elements) for both sampling phase ($\phi_1$) and transfer phase ($\phi_2$). They are not shown in the figures because they are implied and deemed obvious to those of ordinary skill in the art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An error canceling comparator based switch capacitor (CBSC) circuit comprising:
   a comparator, a charge pump circuit, and a plurality of capacitors;
   wherein during a sampling phase the CBSC circuit samples both an input voltage and an error due to CBSC circuit non-idealities and during a transfer phase the CBSC amplifies the sampled input voltage and transfers a resultant voltage to a load while canceling the error by reversing a polarity of connection for at least one of said capacitors.

2. The CBSC circuit of claim 1, wherein the sampling phase comprises a preset sub-phase, a charge transfer sub-phase, and a hold sub-phase.

3. The CBSC circuit of claim 1, wherein the transfer phase comprises a preset sub-phase, a charge transfer sub-phase, and a hold sub-phase.

4. The CBSC circuit of claim 1, wherein the load comprises a capacitor.

5. The CBSC circuit of claim 1, wherein said capacitors comprise a sampling capacitor and an integrating capacitor.

6. The CBSC circuit of claim 5, wherein the sampling capacitor is coupled to the input voltage during the sampling phase.

7. The CBSC circuit of claim 6, wherein the integrating capacitor is coupled to the charge pump during the sampling phase, and also coupled to the charge pump during the transfer phase but in a reverse polarity.

8. The CBSC circuit of claim 1, wherein the CBSC circuit cyclically works through the sampling phase and the transfer phase.

9. The CBSC circuit of claim 8, wherein said capacitors comprise a sampling capacitor and an integrating capacitor.

10. The CBSC circuit of claim 9, wherein the sampling capacitor is coupled to the input voltage during the sampling phase.

11. The CBSC circuit of claim 10, wherein the integrating capacitor is coupled to the charge pump during the sampling phase, and also coupled to the charge pump during the transfer phase but in a reverse polarity.

12. The CBSC circuit of claim 9, wherein the integrating capacitor is coupled to the charge pump during the sampling phase, and also coupled to the charge pump during the transfer phase but in a reverse polarity.

13. A method of canceling error in a comparator based switch capacitor (CBSC) circuit comprising a comparator, a charge pump circuit, and a plurality of capacitors, the method comprising:
   operating the CBSC circuit cyclically through a sampling phase and a transfer phase;
   sampling an input voltage and an error due to CBSC circuit non-idealities during the sampling phase; and
   amplifying and transferring the sampled input voltage to a load and canceling the error by reversing a polarity of connection for at least one of said capacitors.

14. The method of claim 13, wherein the load comprises a capacitor.

15. The method of claim 13, wherein the charge pump circuit comprises at least one of the following components: a current source and a current sink.

16. The method of claim 13, wherein the sampling phase comprises a preset sub-phase, a charge transfer sub-phase, and a hold sub-phase.

17. The method of claim 16, wherein the transfer phase comprises a preset sub-phase, a charge transfer sub-phase, and a hold sub-phase.

18. The method of claim 13, wherein said capacitors include a sampling capacitor and an integrating capacitor.

19. The method of claim 18, wherein the sampling capacitor is coupled to the input voltage during the sampling phase.

20. The method of claim 19, wherein the integrating capacitor is coupled to the charge pump during the sampling phase, and also coupled to the charge pump during the transfer phase but in a reverse polarity.

* * * * *